United States Patent
Oh et al.

(10) Patent No.: US 10,089,040 B2
(45) Date of Patent: Oct. 2, 2018

(54) MEMORY APPARATUS RELATING TO ON DIE TERMINATION

(71) Applicant: SK hynix Inc., Icheon-si, Gyeonggi-do (KR)

(72) Inventors: Seung Wook Oh, Icheon-si (KR); Hyun Seung Kim, Icheon-si (KR); Jin Youp Cha, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 40 days.

(21) Appl. No.: 15/261,143

(22) Filed: Sep. 9, 2016

(65) Prior Publication Data

US 2017/0351460 A1 Dec. 7, 2017

(30) Foreign Application Priority Data

Jun. 3, 2016 (KR) ........................ 10-2016-0069602

(51) Int. Cl.
*G06F 3/06* (2006.01)

(52) U.S. Cl.
CPC .......... *G06F 3/0659* (2013.01); *G06F 3/0604* (2013.01); *G06F 3/0679* (2013.01)

(58) Field of Classification Search
CPC ..... G06F 3/0659; G06F 3/0679; G06F 3/0604
See application file for complete search history.

(56) References Cited

U.S. PATENT DOCUMENTS

| 2005/0204094 A1* | 9/2005 | Rotithor | G06F 12/0215 711/105 |
| 2008/0164904 A1* | 7/2008 | Kim | G11O 5/063 326/30 |
| 2010/0001762 A1* | 1/2010 | Kim | G11C 7/22 326/93 |
| 2013/0214833 A1* | 8/2013 | Kim | G11C 7/1066 327/156 |
| 2016/0028395 A1* | 1/2016 | Bains | H03K 19/0005 326/30 |
| 2017/0213585 A1* | 7/2017 | Schoenborn | G11C 11/4093 |

FOREIGN PATENT DOCUMENTS

KR 1020130003551 A 1/2013

* cited by examiner

*Primary Examiner* — David Yi
*Assistant Examiner* — Zubair Ahmed
(74) *Attorney, Agent, or Firm* — William Park & Associates Ltd.

(57) ABSTRACT

A memory apparatus may include a plurality of ranks commonly coupled to an input/output (I/O) terminal. Non-target ranks other than a target rank among the plurality of ranks may be configured to perform an on die termination operation based on a read operation of the target rank.

8 Claims, 11 Drawing Sheets

MEMORY APPARATUS RELATING TO ON DIE TERMINATION

CROSS-REFERENCES TO RELATED APPLICATION

This application claims priority under 35 U.S.C. 119(a) to Korean application No. 10-2016-0069602, filed on Jun. 3, 2016, in the Korean intellectual property Office, which is incorporated by reference in its entirety as set forth in full.

BACKGROUND

1. Technical Field

Embodiments of the present disclosure may generally relate to a semiconductor integrated circuit, and more particularly, to a memory apparatus with on die termination.

2. Related Art

For stability of input/output (I/O) signals, memory apparatuses may include a circuit configuration for performing an on die termination operation which matches a resistance value of termination, for example, an I/O terminal with a desired value.

SUMMARY

According to an embodiment, there may be provided a memory apparatus. The memory apparatus may include a plurality of ranks commonly coupled to an input/output (I/O) terminal. Non-target ranks other than a target rank among the plurality of ranks may be configured to perform an on die termination operation in a read operation of the target rank.

According to an embodiment, there may be provided a memory chip. The memory chip may include a latency circuit configured to output a read enable signal, a termination enable signal, and a non-target termination enable signal by adjusting latencies of a read command for a target rank, a write command for the target rank, and a read command for a non-target rank and a write command for the non-target rank to match with setup values. The memory chip may include a termination control circuit configured to select any one of a plurality of preliminary codes according to a combination result of the read enable signal, the termination enable signal, and the non-target termination enable signal combined based on a preset priority and output the selected preliminary code as a control code. The memory chip may include an input/output (I/O) circuit configured to perform an on die termination operation according to the control code.

DETAILED DESCRIPTION

Hereinafter, examples of embodiments will be described in below with reference to the accompanying drawings. Examples of embodiments are described herein with reference to cross-sectional illustrations that are schematic illustrations of various embodiments (and intermediate structures). As such, variations from the shapes of the illustrations as a result, for example, of manufacturing techniques and/or tolerances, are to be expected. Thus, examples of the embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

The embodiments may be described herein with reference to cross-section and/or plan illustrations that are schematic illustrations of idealized embodiments. However, the embodiments should not be limited. Although a few embodiments will be shown and described, it will be appreciated by those of ordinary skill in the art that changes may be made in these examples of embodiments without departing from the principles and spirit of the disclosure.

One or more examples of embodiments may be provided to a semiconductor system capable of performing a stable on die termination operation.

Figure 1:
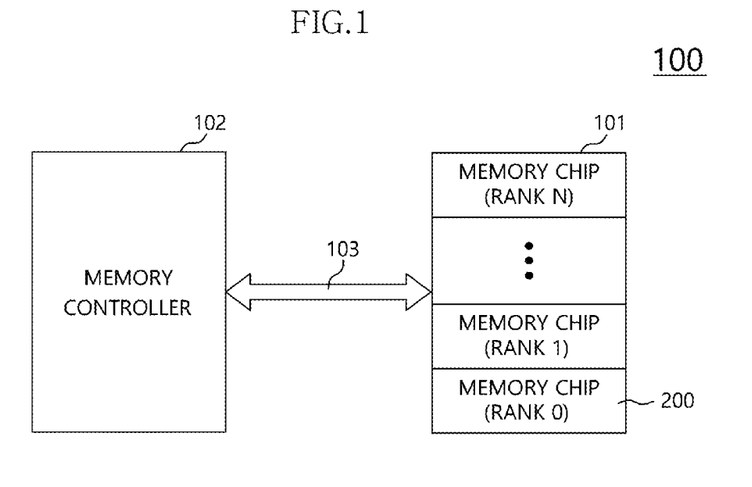
FIG. 1 is a diagram illustrating a representation of an example of a configuration of a semiconductor system according to an embodiment.

Referring to FIG. 1, a semiconductor system 100 according to an embodiment may include a memory apparatus 101 and an external system, for example, a memory controller 102.

The memory apparatus 101 may be a memory module including a plurality of memory chips 200. Having a memory module that includes a plurality of memory chips 200 is one of the methods used for improving the integration degree of a semiconductor apparatus or memory apparatus 101. In an embodiment, a semiconductor apparatus may include a memory apparatus 101 and a memory controller 102. In an embodiment, a semiconductor system 100 may include a semiconductor apparatus.

The plurality of memory chips 200 may be configured in a stacked form, and may be couple to exchange signals through a through-hole electrode (not illustrated), for example, a through silicon via (TSV).

The memory apparatus 101 may operate in rank units. That is, each of the plurality of memory chips 200 may be divided into ranks.

For example, the plurality of memory chips 200 may be divided into rank 0 to rank N.

Rank 0 to rank N may be commonly coupled to an input/output (I/O) terminal for data I/O of the memory apparatus 101.

The memory apparatus 101 and the memory controller 102 may be coupled through a channel 103.

The memory apparatus 101 and the memory controller 102 may transmit and receive data, an address, and/or a command to and from each other through the channel 103.

The command provided from the memory controller 102 may include a rank selection signal and an address signal. The memory controller 102 may define the operation of the memory apparatus 101 to a read operation or a write operation using the address signal and divide the plurality of memory chips 200, that is, rank 0 to rank N into target ranks and non-target ranks using the rank selection signal.

The memory controller 102 to be described later may provide a read command and a write command for the target rank and a read command and a write command for the non-target rank to the memory apparatus 101 regardless of a priority.

The memory apparatus 101 may perform the on die termination operation on the target rank while the write operation on the target rank is performed. The memory apparatus 101 may perform the on die termination operation on the non-target rank while the read or write operation on the target rank is performed. The memory apparatus 101 may process the read command and the write command for the target rank and the read command and the write command for the non-target rank according to the preset priority, for example, in order of the read command for the target rank, the write command for the target rank, the read command for the non-target rank, and the write command for the non-target rank.

The semiconductor system 100 according to an embodiment may perform the on die termination operation on the non-target rank while the read or write operation on the target rank is performed. The on die termination operation will be described with reference to FIGS. 2 and 3.

Figure 2:
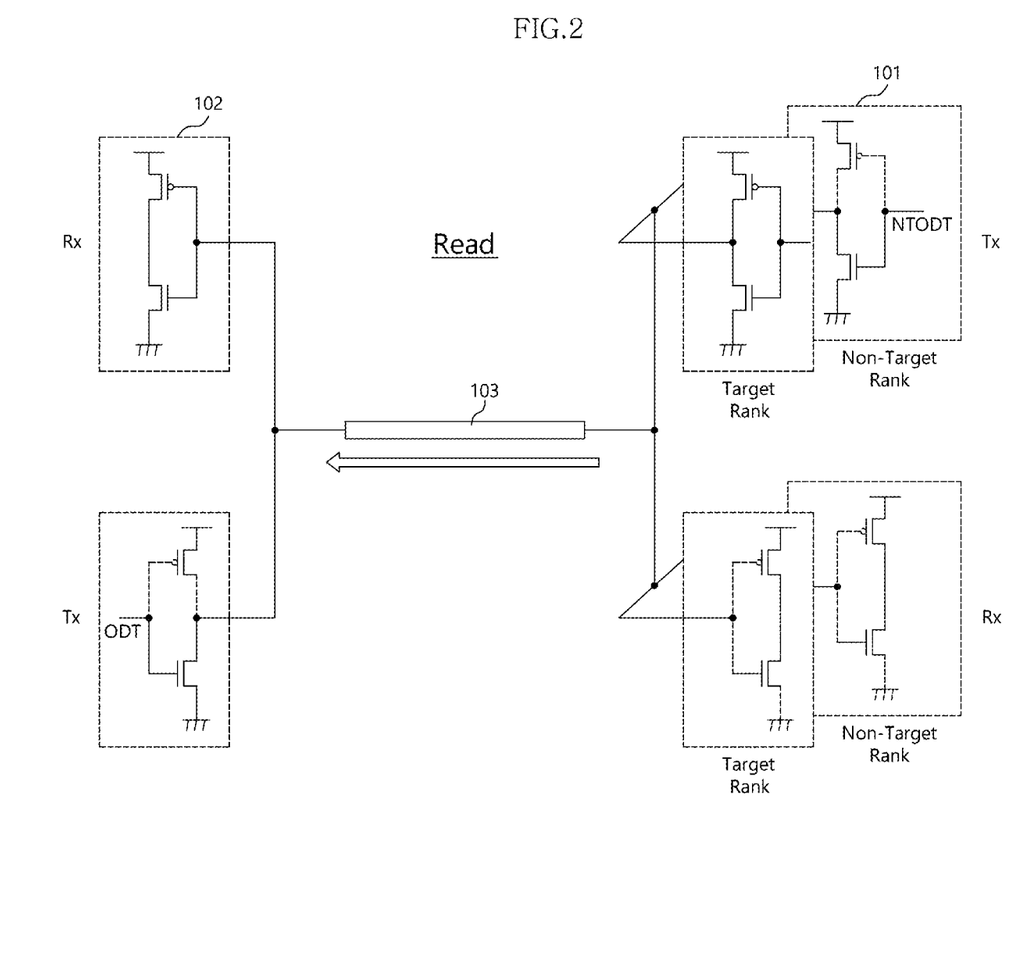
FIGS. 2 and 3 are diagrams explaining a concept of an on die termination operation according to an embodiment.
Figure 3:
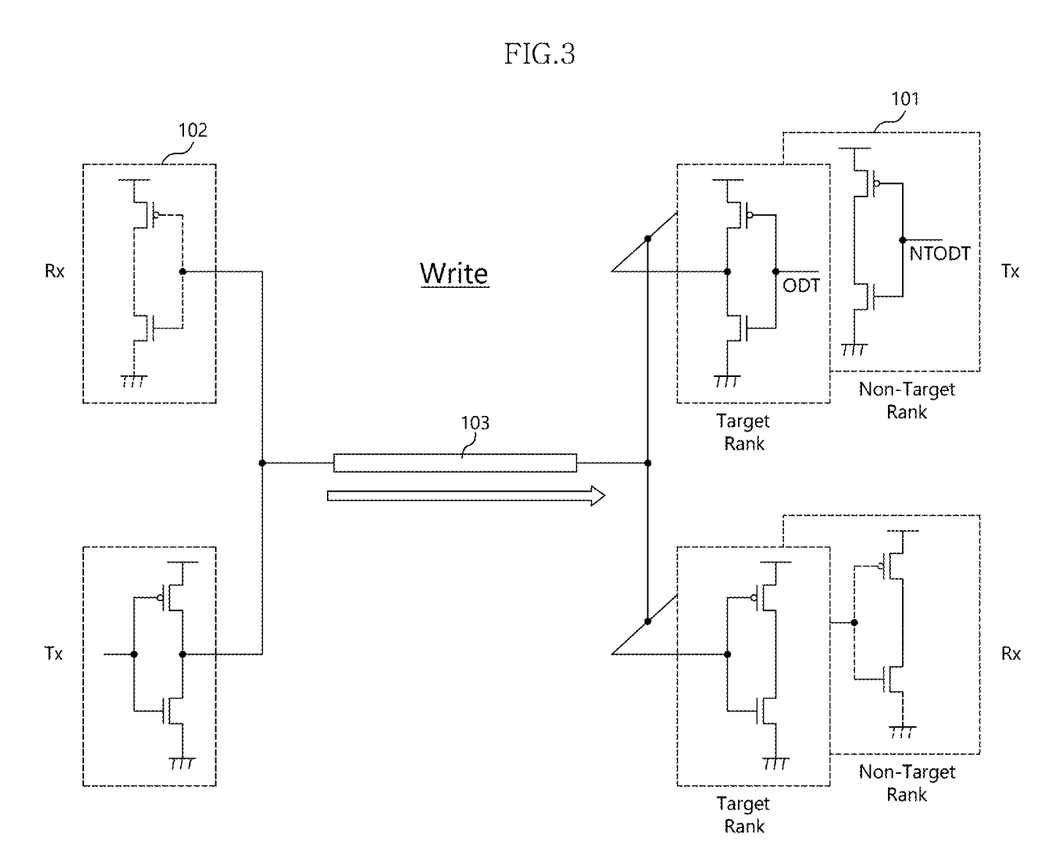

FIGS. 2 and 3 illustrate, for brevity, only a transmitter Tx and a receiver Rx of an I/O terminal of each rank in the configuration of the memory apparatus 101.

Various commands may be commonly provided to the ranks of the memory apparatus 101.

Each of the ranks of the memory apparatus 101 may determine whether or not the rank itself is selected according to the rank selection signal included in the command.

The target rank may be a rank which receives the read command or the write command from the memory controller 102 and is designate to perform the read operation or the write operation through the rank selection signal.

The non-target rank may be a rank which receives the read command or the write command from the memory controller 102 and is designated not to perform the read operation or the write operation through the rank selection signal.

For example, when the memory controller 102 provides the rank selection signal having a value for selecting the rank 0 together with the read command, the rank 0 among the rank 0 to the rank N may be the target rank and the rank 1 to the rank N other than the rank 0 may be the non-target ranks.

For clarity, referring to FIGS. 2 and 3, the on die termination operation for the target rank may be represented as ODT and the on die termination operation for the non-target rank may be represented as NTODT.

Referring to FIG. 2, in the read operation, the transmitter Tx of the target rank of the memory apparatus 101 may transmit data through the channel 103. A receiver Rx of the memory controller 102 may receive the data transmitted through the channel 103 and the transmitter Tx of the memory controller 102 may perform the on die termination operation ODT.

The transmitter Tx of the non-target rank of the memory apparatus 101 may also perform the on die termination operation NTODT.

The receiver Rx of the target rank of the memory apparatus 101 and the receiver Rx of the non-target rank of the memory apparatus 101 may not perform the on die termination operation.

Referring to FIG. 3, in the write operation, a transmitter Tx of the memory controller 102 may transmit the data through the channel 103. The receiver Rx of the target rank of the memory apparatus 101 may receive data transmitted through the channel 103 and the transmitter Tx of the target rank of the memory apparatus 101 may perform the on die termination operation ODT.

The receiver Rx of the non-target rank of the memory apparatus 101 may not perform the on die termination operation.

The transmitter Tx of the target rank of the memory apparatus 101 and the transmitter Tx of the non-target rank of the memory apparatus 101 may perform the on die termination operations ODT and NTODT.

The configuration of the rank, that is, the memory chip 200 will be described with reference to FIGS. 4 to 9.

Figure 4:
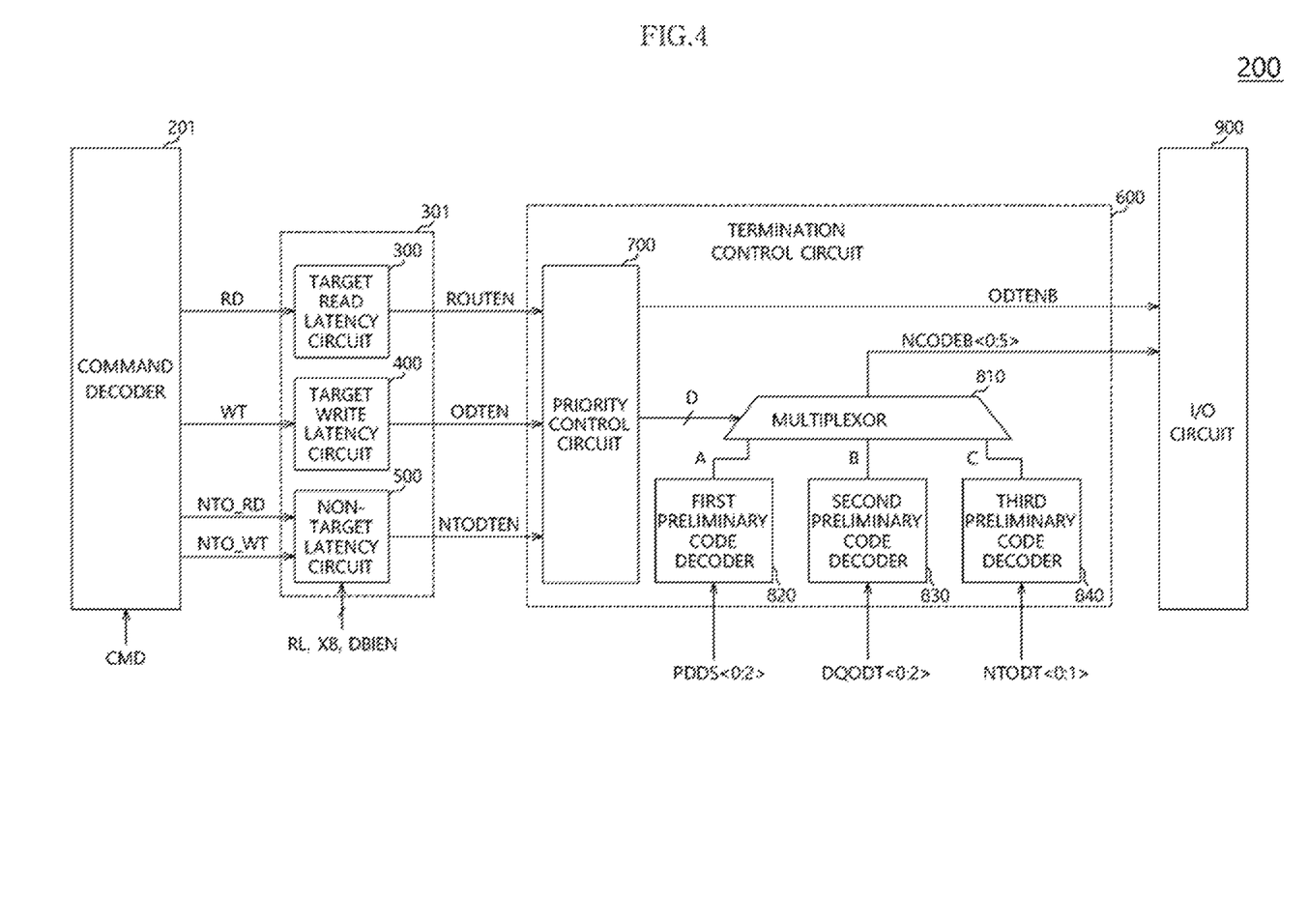
FIG. 4 is a diagram illustrating a representation of an example of a configuration of a memory chip of FIG. 1.

Referring to FIG. 4, the memory chip 200 may include a command decoder 201, a latency circuit 301, a target read latency circuit 300, a target write latency circuit 400, a non-target latency circuit 500, a termination control circuit 600, and an I/O circuit 900. In an embodiment, the latency circuit 301 may include a target read latency circuit 300, a target write latency circuit 400, a non-target latency circuit 500.

The command decoder 201 may generate internal commands by decoding an external command (CMD).

The command decoder 201 may receive, for example, the external command CMD through the channel 103 from the memory controller 102 of FIG. 1.

The internal commands may include first to fourth command signals RD, WT, NTO_RD, and NTO_WT.

The first command signal RD may be a signal generated by decoding the read command for the target rank. The second command signal WT may be a signal generated by decoding the write command for the target rank. The third command signal NTO_RD may be a signal generated by decoding the read command for the non-target rank. The fourth command signal NTO_WT may be a signal generated by decoding the write command for the non-target rank.

The target read latency circuit 300 may output a read enable signal ROUTEN by adjusting the latency of the first command signal RD to match with a corresponding setup value.

The target write latency circuit 400 may output a termination enable signal ODTEN by adjusting the latency of the second command signal WT to match with a corresponding setup value.

The termination enable signal ODTEN may be used as a signal for activating the on die termination operation for the target rank.

The non-target latency circuit 500 may output a non-target termination enable signal NTODTEN by adjusting the latency of the third command signal NTO_RD and the latency of the fourth command signal NTO_WT according to operation setup information RL, X8, and DBIEN.

The non-target termination enable signal NTODTEN may be used as a signal for activating the on die termination operation for the non-target rank.

The read latency RL, the data I/O mode signal X8, and the data bus inversion (DBI) enable signal DBIEN may be used as the operation setup information.

For example, the data I/O mode signal X8 may have different logic levels when the memory chip 200 operates in an X8 mode rather than, for example, when the memory chip operates in an X16 mode.

The DBI enable signal DBIEN may have different logic levels when the DBI function is enabled and when the DBI function is disabled.

The I/O circuit 900 may be coupled to an I/O terminal for data I/O of the memory apparatus 101.

The I/O circuit 900 may perform the on die termination operation according to a termination control signal ODTENB and a control code NCODEB<0:5>.

The I/O circuit 900 may include the transmitter Tx and the receiver Rx described with reference to FIGS. 2 and 3 and may control the transmitter Tx or the receiver Rx to be terminated to a resistance value corresponding to the control code NCODEB<0:5> according to the termination control signal ODTENB.

The termination control circuit 600 may be configured to selectively process the on die termination operation according to the write command for the target rank, the read command for the non-target rank, and the write command for the non-target rank based on the preset priority.

The read enable signal ROUTEN, the termination enable signal ODTEN, and the non-target termination enable signal NTODTEN may only have timing differences from the external command CMD, and may be substantially generated according to the read command for the target rank, the write command for the target rank, and the read command for the non-target rank and the write command for the non-target rank.

The termination control circuit 600 may combine the read enable signal ROUTEN, the termination enable signal ODTEN, and the non-target termination enable signal NTODTEN according to the preset priority, select one among a plurality of preliminary codes according to the combination result, and output the selected preliminary code as the control code NCODEB<0:5>.

The termination control circuit 600 may generate the termination control signal ODTENB according to the read enable signal ROUTEN, the termination enable signal ODTEN, and the non-target termination enable signal NTODTEN.

The termination control circuit 600 may include a priority control circuit 700, a multiplexer 810, and first to third preliminary code decoders 820, 830, and 840.

The priority control circuit 700 may generate a plurality of multiplexing control signals D and the termination control signal ODTENB by combining the read enable signal ROUTEN, the termination enable signal ODTEN, and the non-target termination enable signal NTODTEN.

The multiplexer 810 may select one among first to third preliminary codes A, B, and C according to the plurality of multiplexing control signals and output the selected preliminary code as the control code NCODEB<0:5>.

The first preliminary code decoder 820 may generate the first preliminary code A by decoding a driver strength code signal PDDS<0:2>.

The driver strength code signal PDDS<0:2> may be a code signal for adjusting a strength of a pull-down driver of the transmitter Tx or/and the receiver Rx described in FIG. 2 in the read operation.

The second preliminary code decoder 830 may generate the second preliminary code B by decoding a termination resistor code signal DQOUT<0:2>.

The termination resistor code signal DQODT<0:2> may be a code signal for adjusting a resistance value of a termination resistor of the transmitter Tx or/and the receiver Rx in the on die termination operation.

The third preliminary code decoder 840 may generate the third preliminary code C by decoding a non-target termination resistor code signal NTODT<0:1>.

The non-target termination resistor code signal NTODT<0:1> may be a code signal for adjusting the resistance value of the termination resistor of the transmitter Tx or/and the receiver Rx in the non-target on die termination operation.

Figure 5:
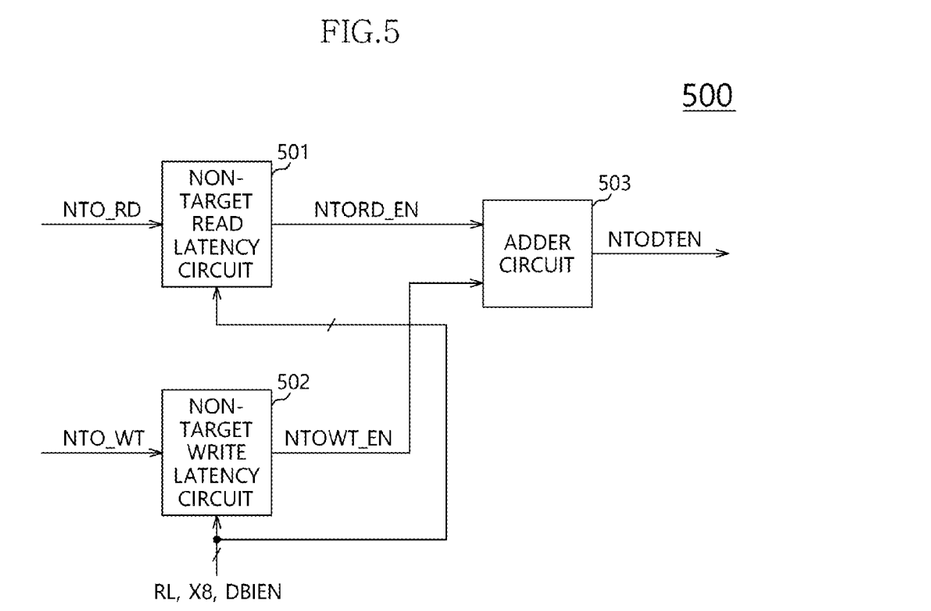
FIG. 5 is a diagram illustrating a representation of an example of a configuration of a non-target latency circuit of FIG. 4.

Referring to FIG. 5, the non-target latency circuit 500 of FIG. 4 may include a non-target read latency circuit 501, a non-target write latency circuit 502, and an adder circuit 503.

The non-target read latency circuit 501 may output a non-target read termination enable signal NTORD_EN by adjusting the latency of the third command signal NTO_RD according to the operation setup information RL, X8, and DBIEN.

The non-target write latency circuit 502 may output a non-target write termination enable signal NTOWT_EN by adjusting the latency of the fourth command signal NTO_WT according to the operation setup information RL, X8, and DBIEN.

The adder circuit 503 may add, for example, perform a logic operation, for example, OR operation on the non-target read termination enable signal NTORD_EN and the non-target write termination enable signal NTOWT_EN and output the addition result as the non-target termination enable signal NTODTEN.

Figure 6:
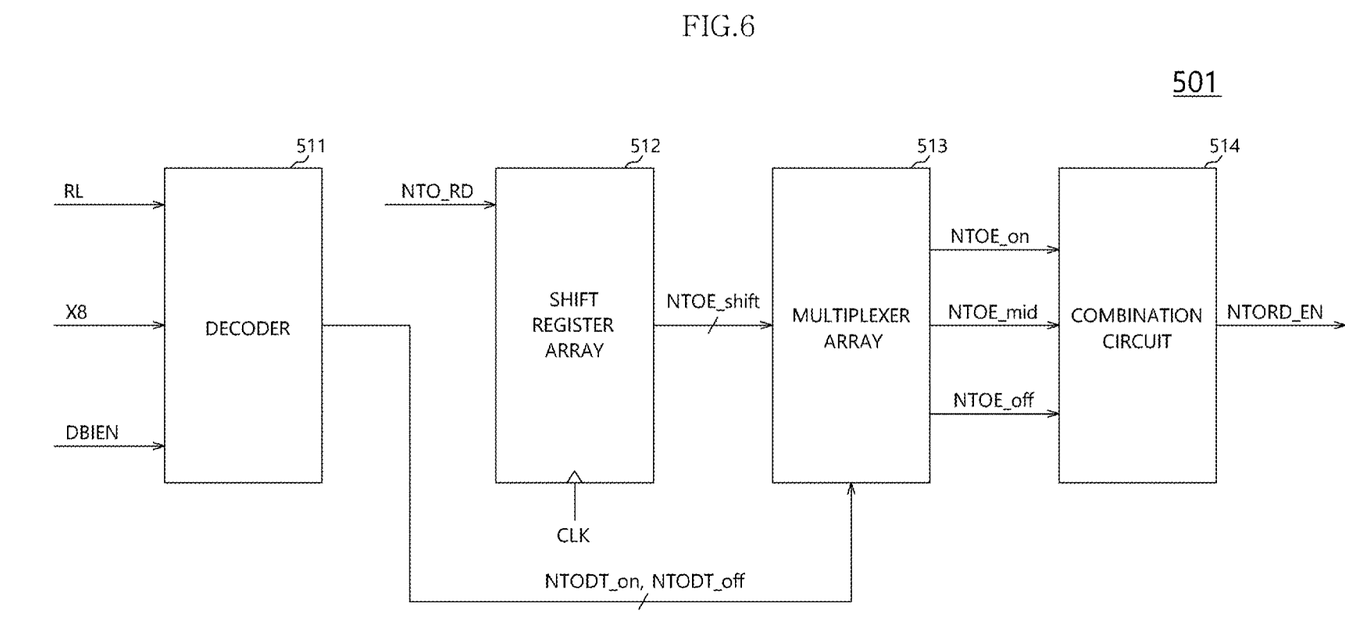
FIG. 6 is a diagram illustrating a representation of an example of a configuration of a non-target read latency circuit of FIG. 5.

Referring to FIG. 6, the non-target read latency circuit 501 of FIG. 5 may include a decoder 511, a shift register array 512, a multiplexer array 513, and a combination circuit 514.

The decoder 511 may generate a plurality of decoding signal sets NTODT_on and NTODT_off by decoding the operation setup information, that is, the read latency RL, the data I/O mode signal X8, and the DBI enable signal DBIEN.

The plurality of decoding signal sets NTODT_on and NTODT_off may include signals having different timings from each other according to the combination of the read latency RL, the data I/O mode signal X8, and the DBI enable signal DBIEN.

The shift register array 512 may generate a plurality of shift signals NTOE_shift by shifting the third command signal NTO_RD based on a clock signal CLK.

The multiplexer array 513 may generate a plurality of timing signals NTOE_on, NTOE_mid, and NTOE_off by selecting a portion of the plurality of shift signals NTOE_shift according to the plurality of decoding signal sets NTODT_on and NTODT_off.

The timing signal NTOE_on among the plurality of timing signals NTOE_on, NTOE_mid, and NTOE_off may be a signal for defining a start timing of the non-target termination operation, the timing signal NTOE_off may be a signal for defining an end timing of the non-target termination operation, and the timing signal NTOE_mid may be a signal for defining an intermediate timing of the timing signals NTOE_on and NTOE_off.

The combination circuit 514 may generate the non-target read termination enable signal NTORD_EN using the plurality of timing signals NTOE_on, NTOE_mid, and NTOE_off.

The combination circuit 514 may be configured to include a SR latch circuit or an adder circuit according to pulse widths of the plurality of timing signals NTOE_on, NTOE_mid, and NTOE_off. The combination circuit 514 may be designed using both the SR latch circuit and the adder circuit and may be configured in such a manner that one of the SR latch circuit and the adder circuit, which is suitable for the pulse widths of the plurality of timing signals NTOE_on, NTOE_mid, and NTOE_off, may be used and the other may be inactivated.

Figure 7:
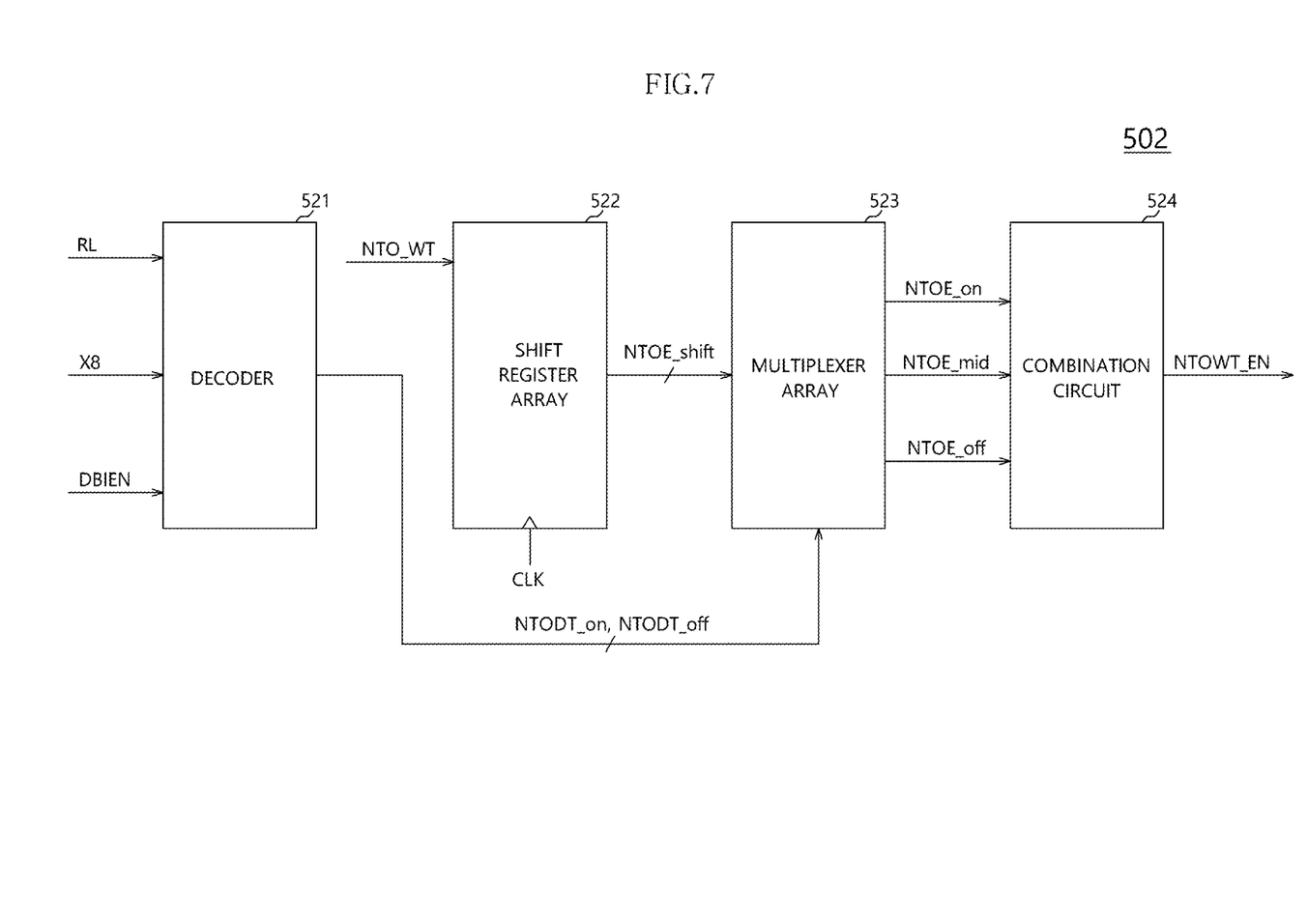
FIG. 7 is a diagram illustrating a representation of an example of a configuration of a non-target write latency circuit of FIG. 5.

Referring to FIG. 7, the non-target write latency circuit 502 of FIG. 5 may include a decoder 521, a shift register array 522, a multiplexer array 523, and a combination circuit 524.

The decoder 521 may generate a plurality of decoding signal sets NTODT_on and NTODT_off by decoding the operation setup information, that is, the read latency RL, the data I/O mode signal X8, and the DBI enable signal DBIEN.

The plurality of decoding signal sets NTODT_on and NTODT_off may include signals having different timings from each other according to the combination of the read latency RL, the data I/O mode signal X8, and the DBI enable signal DBIEN.

The shift register array 522 may generate a plurality of shift signals NTOE_shift by shifting the fourth command signal NTO_WT based on the clock signal CLK.

The multiplexer array 523 may generate a plurality of timing signals NTOE_on, NTOE_mid, and NTOE_off by selecting a portion of the plurality of shift signals NTOE_shift according to the plurality of decoding signal sets NTODT_on and NTODT_off.

The timing signal NTOE_on among the plurality of timing signals NTOE_on, NTOE_mid, and NTOE_off may be a signal for defining a start timing of the non-target termination operation, the timing signal NTOE_off may be a signal for defining an end timing of the non-target termination operation, and the timing signal NTOE_mid may be a signal for defining an intermediate timing of the timing signals NTOE_on and NTOE_off.

The combination circuit 524 may generate the non-target write termination enable signal NTOWT_EN using the plurality of timing signals NTOE_on, NTOE_mid, and NTOE_off.

The combination circuit 524 may be configured of a SR latch circuit or an adder circuit according to pulse width of the plurality of timing signals NTOE_on, NTOE_mid, and NTOE_off. The combination circuit 524 may be designed using both the SR latch circuit and the adder circuit and may be configured in such a manner that one of the SR latch circuit and the adder circuit, which is suitable for the pulse widths of the plurality of timing signals NTOE_on, NTOE_mid, and NTOE_off, may be used and the other may be inactivated. Hereinafter, the operation of the non-target read latency circuit 501 will be described with reference to FIGS. 8A and 8B.

Figure 8A:
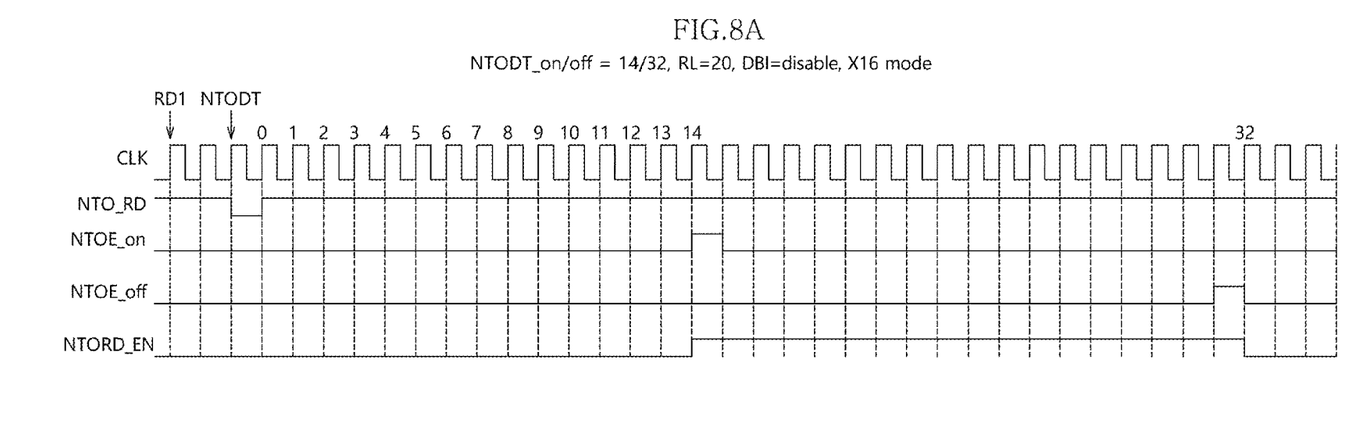
FIGS. 8A and 8B are waveform diagrams illustrating an operation of the non-target read latency circuit of FIG. 5.
Figure 8B:
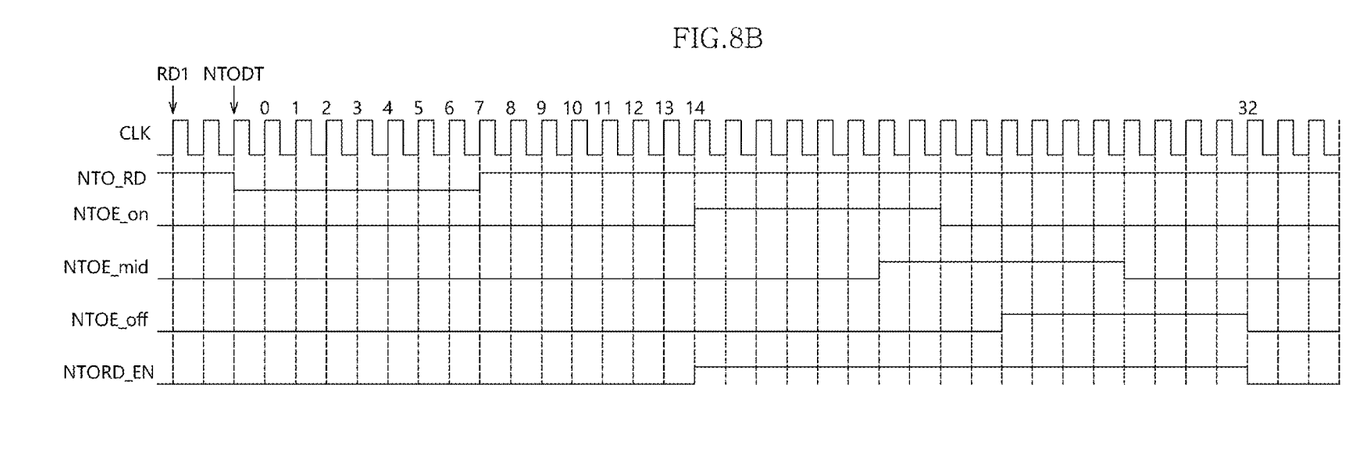

First, it may be assumed that NTODT_on/off=14/32 (CLK reference), RL=20, the DBI function is disabled, and the memory chip 200 operates as the X16 mode.

The third command signal NTO_RD may have a pulse width which is less than or equal to one cycle of the clock signal CLK or is larger than one cycle of the clock signal CLK according to the circuit design.

Referring to FIG. 8A, when the non-target termination command NTODT is input after a read command RD1, the third command signal NTO_RD may be activated.

The plurality of timing signals NTOE_on, NTOE_mid, and NTOE_off may be activated according to the third command signal NTO_RD, and the non-target read termination enable signal NTORD_EN may be activated according to the activation of the plurality of timing signals.

When the pulse width of the third command signal NTO_RD is determined to be less than or equal to one cycle of the clock signal CLK, the plurality of timing signals NTOE_on, NTOE_mid, and NTOE_off generated using the third command signal NTO_RD as a source signal may have the same pulse width. Accordingly, the combination circuit 514 may be configured of a SR latch circuit and may generate the non-target read termination enable signal NTORD_EN by latching a rising edge of the timing signal NTOE_on and a falling edge of the timing signal NTOE_off at a rising edge of the clock signal CLK. As illustrated in FIG. 8B, when the pulse width of the third command signal NTO_RD is larger than one cycle of the clock signal CLK, the combination circuit 514 is configured of an adder circuit and may generate the non-target read termination enable signal NTORD_EN by adding the timing signals NTOE_on, NTOE_mid, and NTOE_off.

Hereinafter, the operation of the non-target write latency circuit 502 will be described with reference to FIGS. 9A and 9B.

First, it may be assumed that NTODT_on/off=14/32 (CLK reference), WL=20, the DBI function is disabled, and the memory chip 200 operates as the X16 mode.

The fourth command signal NTO_WT may have a pulse width which is less than or equal to one cycle of the clock signal CLK or is larger than one cycle of the clock signal CLK according to the circuit design.

Figure 9A:
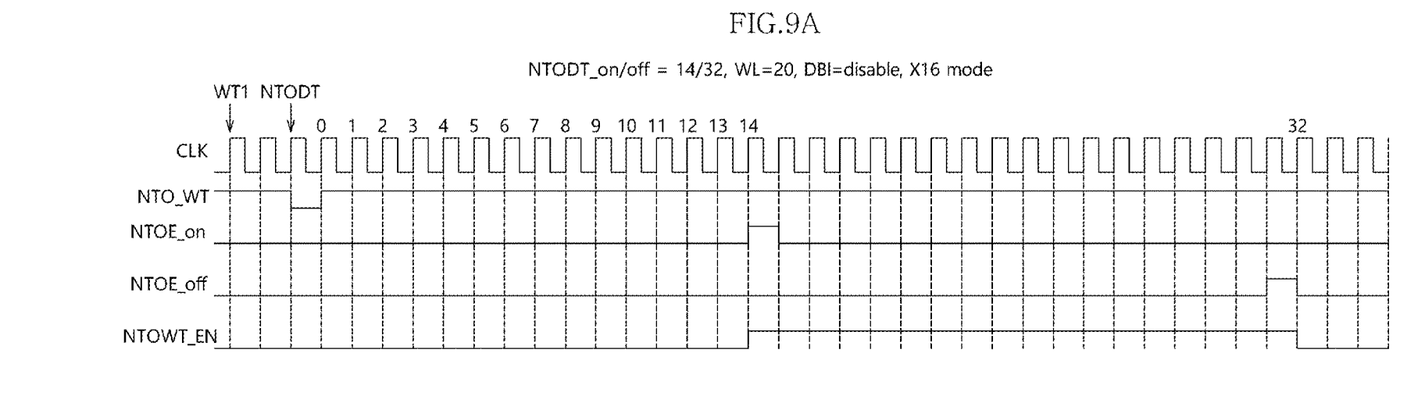
FIGS. 9A and 9B are waveform diagrams illustrating an operation of the non-target write latency circuit of FIG. 5.
Figure 9B:
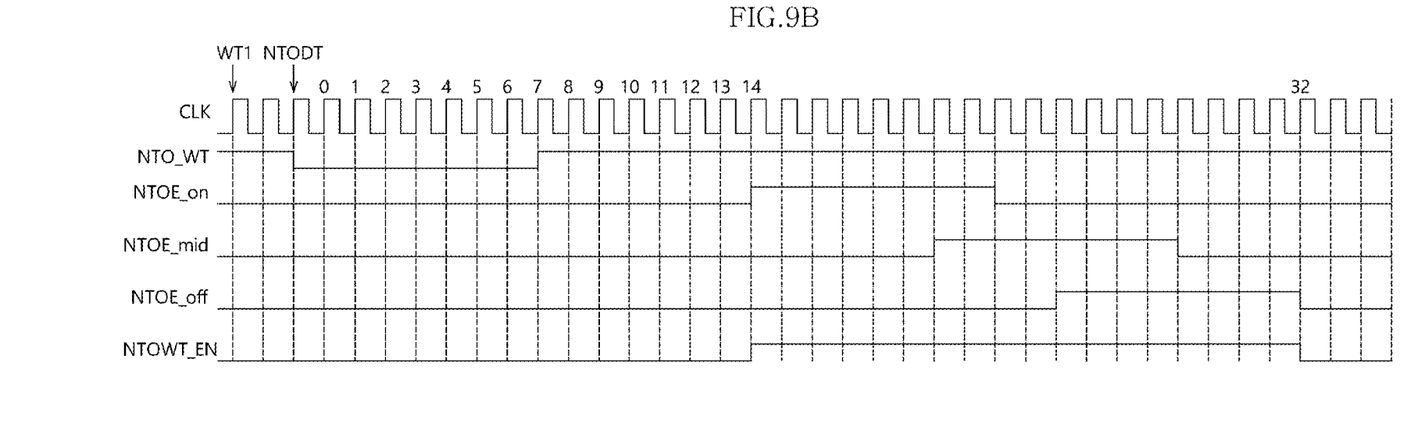

Referring to FIG. 9A, when the non-target termination command NTODT is input after a write command WT1, the fourth command signal NTO_WT may be activated.

The plurality of timing signals NTOE_on, NTOE_mid, and NTOE_off may be activated according to the fourth command signal NTO_WT, and the non-target write termination enable signal NTOWT_EN may be activated according to the activation of the plurality of timing signals.

When the pulse width of the fourth command signal NTO_WT is determined to be less than or equal to one cycle of the clock signal CLK, the plurality of timing signals NTOE_on, NTOE_mid, and NTOE_off generated using the fourth command signal NTO_WT as a source signal may have the same pulse width. Accordingly, the combination circuit 524 may be configured of a SR latch circuit and may generate the non-target write termination enable signal NTOWT_EN by latching the rising edge of the timing signal NTOE_on and the falling edge of the timing signal NTOE_off at the rising edge of the clock signal CLK. Referring to FIG. 9B, when the pulse width of the fourth command signal NTO_WT is larger than one cycle of the clock signal CLK, the combination circuit 524 is configured of an adder circuit and may generate the non-target write termination enable signal NTOWT_EN by adding the timing signals NTOE_on, NTOE_mid, and NTOE_off.

Figure 10:
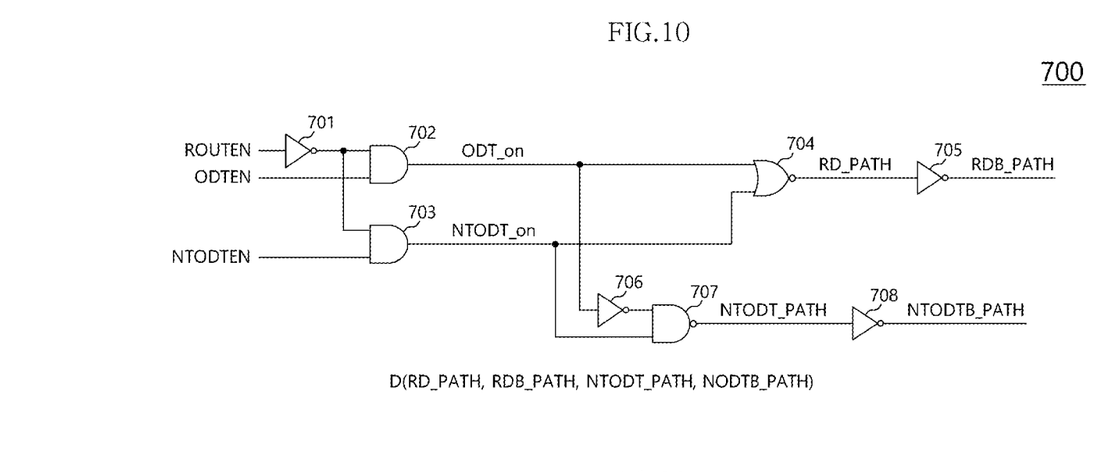
FIG. 10 is a diagram illustrating a representation of an example of a configuration of a priority control circuit of FIG. 4.

Referring to FIG. 10, the priority control circuit 700 may include first to eighth logic gates 701 to 708.

The first logic gate 701 may invert the read enable signal ROUTEN and output the inverted read enable signal.

The second logic gate 702 may perform a logic AND operation on an output of the first logic gate 701 and the termination enable signal ODTEN and output the AND operation result as an output signal ODT_on.

The third logic gate 703 may perform a logic AND operation on the output of the first logic gate 701 and the non-target termination enable signal NTODTEN and output the AND operation result as an output signal NTODT_on.

The fourth logic gate 704 may generate a multiplexing control signal RD_PATH among the plurality of multiplexing control signals D by performing a logic NOR operation on the output signal ODT_on of the second logic gate 702 and the output signal NTODT_on of the third logic gate 703.

The fifth logic gate 705 may generate a multiplexing control signal RDB_PATH among the plurality of multiplexing control signals D by inverting the multiplexing control signal RD_PATH.

The sixth logic gate 706 may invert the output signal ODT_on of the second logic gate 702 and output the inverting result.

The seventh logic gate 707 may generate a multiplexing control signal NTODT_PATH among the plurality of multiplexing control signals D by performing a logic NAND operation on an output signal of the sixth logic gate 706 and the output signal NTODT_on of the third logic gate 703.

The eighth logic gate 708 may generate a multiplexing control signal NTODTB_PATH among the plurality of multiplexing control signals D by inverting the multiplexing control signal NTODT_PATH.

Figure 11:
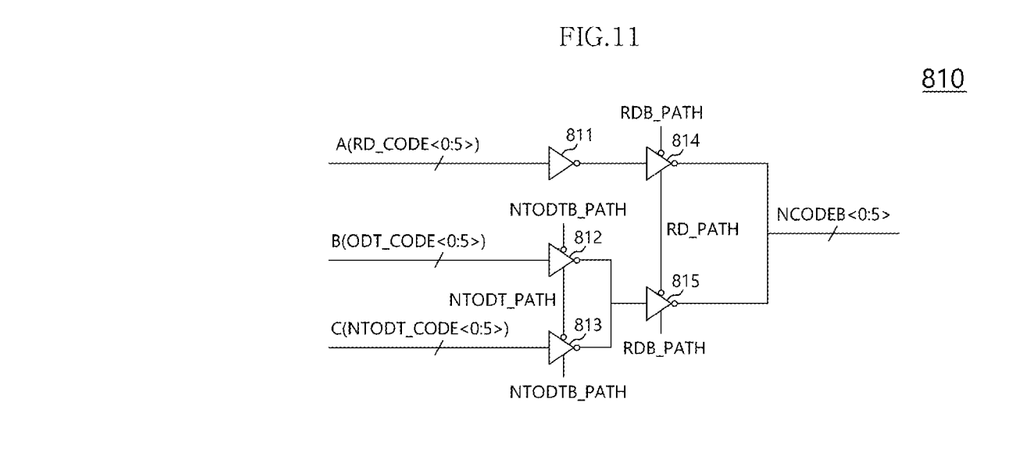
FIG. 11 is a diagram illustrating a representation of an example of a configuration of a multiplexer of FIG. 4.

Referring to FIG. 11, the multiplexer 810 may include first to fifth logic gate arrays 811 to 815.

The first logic gate array 811 may invert a first preliminary code A(RD_CODE<0:5>) and output the inverting result.

The second logic gate array 812 may invert a second preliminary code B(ODT_CODE<0:5>) and output the inverting result when the multiplexing control signal NTODT_PATH is a high level. Further, the logic levels of the signals may be different from or the opposite of those described. For example, a signal described as having a logic "high" level may alternatively have a logic "low" level, and a signal described as having a logic "low" level may alternatively have a logic "high" level.

The third logic gate array 813 may invert a third preliminary code C(NTODT_CODE<0:5>) and output the inverting result when the multiplexing control signal NTODT_PATH is a low level. Further, the logic levels of the signals may be different from or the opposite of those described. For example, a signal described as having a logic "high" level may alternatively have a logic "low" level, and a signal described as having a logic "low" level may alternatively have a logic "high" level.

The fourth logic gate array 814 may invert an output of the first logic gate array 811 and output the inverting result as the control code NCODEB<0:5> when the multiplexing control signal RD_PATH is a high level. Further, the logic levels of the signals may be different from or the opposite of those described. For example, a signal described as having a logic "high" level may alternatively have a logic "low" level, and a signal described as having a logic "low" level may alternatively have a logic "high" level.

The fifth logic gate array 815 may invert an output of the second logic gate array 812 or an output of the third logic gate array 813 and output the inverting result as the control code NCODEB<0:5> when the multiplexing control signal RD_PATH is a low level. Further, the logic levels of the signals may be different from or the opposite of those described. For example, a signal described as having a logic "high" level may alternatively have a logic "low" level, and a signal described as having a logic "low" level may alternatively have a logic "high" level.

Referring to FIGS. 10 and 11, when the read enable signal ROUTEN is activated to a high level, that is, when the read operation is performed, the multiplexing control signal RD_PATH is a high level, and the first preliminary code A(RD_CODE<0:5>) may be provided to the I/O circuit 900 as the control code NCODEB<0:5>.

As described above, the preliminary code A may be a signal generated by decoding the driver strength code signal PDDS<0:2> for adjusting the strength of the pull-down driver of the transmitter Tx or/and the receiver Rx of FIG. 2.

The read operation may be accomplished by adjusting the strength of the pull-down driver of the transmitter Tx or/and the receiver Rx of FIG. 2 according to the control code NCODEB<0:5>.

When the termination enable signal ODTEN is activated to a high level in a state that the read enable signal ROUTEN is inactivated to a low level, the multiplexing control signal NTODT_PATH may be a high level, and thus the second preliminary code B(ODT_CODE<0:5>) may be provided to the I/O circuit 900 as the control code NCODEB<0:5>.

Accordingly, the on die termination operation for the target rank may be accomplished according to the control code NCODEB<0:5>.

When the non-target termination enable signal NTODTEN is activated to a high level in a state that both the read enable signal ROUTEN and the termination enable signal ODTEN are inactivated to a low level, the multiplexing control signal NTODT_PATH may be a low level, and thus the third preliminary code C(NTODT_CODE<0:5>) may be provided to the I/O circuit 900 as the control code NCODEB<0:5>.

Accordingly, the on die termination operation for the non-target rank may be accomplished according to the control code NCODEB<0:5>.

As described above, the read operation may be most preferentially processed even when the termination command or the non-target termination command is input during the read operation, and the read operation may be preferentially performed rather than the termination operation even when the read command is input during the on die termination operation.

The semiconductor systems and memory chips as discussed above (see FIGS. 1-11) are particular useful in the design of other memory devices, processors, and computer systems. For example, referring to FIG. 12, a block diagram of a system employing a semiconductor system and or memory chip in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

Figure 12:
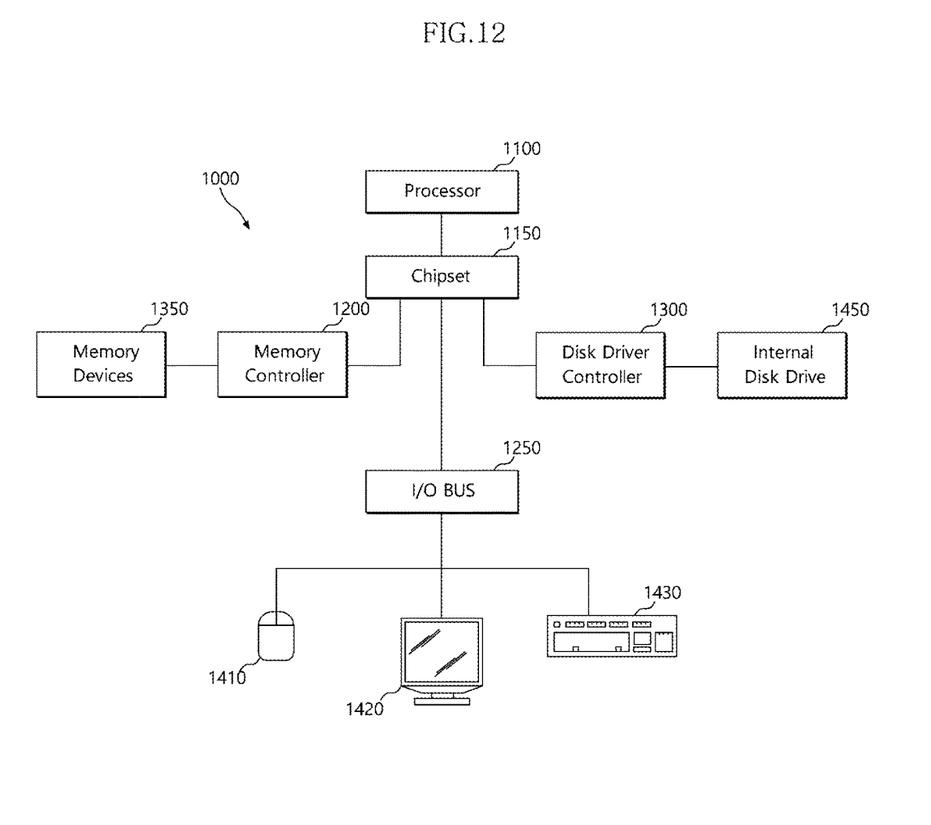
FIG. 12 illustrates a block diagram of an example of a representation of a system employing a semiconductor system and or a memory chip with the various embodiments discussed above with relation to FIGS. 1-11.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor system and or memory chip as discussed above with reference to FIGS. 1-11. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor system and or memory chip as discussed above with relation to FIGS. 1-11, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 12 is merely one example of a semiconductor system and or memory chip as discussed above with relation to FIGS. 1-11. In alternate embodiments, such as, for example but not limited to, cellular phones or digital cameras, the components may differ from the embodiments illustrated in FIG. 12.

The above embodiments are illustrative and not limitative. Various alternatives and equivalents are possible. The examples of embodiments are not limited by the embodiments described herein. Nor is the disclosure limited to any specific type of semiconductor device. Other additions, subtractions, or modifications are obvious in view of the present disclosure and are intended to fall within the scope of the appended claims.

What is claimed is:

1. A memory chip comprising:
    a latency circuit configured to output a read enable signal, a termination enable signal, and a non-target termination enable signal by adjusting latencies of a read command for a target rank, a write command for the target rank, and a read command for a non-target rank and a write command for the non-target rank to match with setup values;
    a termination control circuit configured to select any one of a plurality of preliminary codes according to a combination result of the read enable signal, the termination enable signal, and the non-target termination enable signal combined based on a preset priority and output the selected preliminary code as a control code; and
    an input/output (I/O) circuit configured to perform an on die termination operation according to the control code,
    wherein the I/O circuit includes a transmitter and a receiver, and
    when the I/O circuit itself is in a non-read operation, the I/O circuit is configured to perform an on die termination operation on the transmitter,
    wherein the latency circuit includes:
    a target read latency circuit configured to output a read enable signal by adjusting a latency of a read command for a target rank,
    a target write latency circuit configured to output a termination enable signal by adjusting a latency of a write command for the target rank,
    a non-target read latency circuit configured to output a non-target read termination enable signal by adjusting a latency of a read command for a non-target rank with an operation setup information,
    a non-target write latency circuit configured to output a non-target write termination enable signal by adjusting a latency of a write command for the non-target rank with the operation setup information, and
    an adder configured to perform a logic operation on the non-target read termination enable signal and the non-target write termination enable signal and output the addition result as a non-target termination enable signal.

2. The memory chip of claim 1, wherein the non-target read latency circuit includes:
    a decoder configured to generate a plurality of decoding signal sets by decoding the operation setup information;
    a shift register array configured to generate a plurality of shift signals by shifting the read command for the non-target rank based on a clock signal;
    a multiplexer array configured to generate a plurality of timing signals by selecting a portion of the plurality of shift signals according to the plurality of decoding signal sets; and
    a combination circuit configured to generate the non-target read termination enable signal using the plurality of timing signals.

3. The memory chip of claim 2, wherein the combination circuit includes a latch circuit or an adder circuit according to pulse widths of the plurality of timing signals.

4. The memory chip of claim 1, wherein the termination control circuit includes:
    a priority control circuit configured to generate a plurality of multiplexing control signals by combining the read enable signal, the termination enable signal, and the non-target termination enable signal; and a multiplexer configured to select the one among the plurality of preliminary codes according to the plurality of multiplexing control signals, and output the selected preliminary code as the control code.

5. The memory chip of claim 1, wherein when the I/O circuit itself is in a non-read operation and a non-write operation, the I/O circuit is configured to perform an on die termination operation on the transmitter.

6. The memory chip of claim 1, wherein the termination control circuit includes a plurality of preliminary code decoders configured to generate the plurality of preliminary codes by decoding with a first preliminary code decoder a driver strength code signal for adjusting a strength of a pull-down driver or pull-up driver of the I/O circuit, with a second preliminary code decoder a termination resistor code signal for adjusting a resistance value of a termination resistor of the I/O circuit when no read operation or no write operation is performed, and with a third preliminary code decoder a non-target termination resistor code signal for adjusting the resistance value of the termination resistor of the I/O circuit when the read operation or the write operation is performed.

7. The memory chip of claim 1, wherein the termination control circuit is configured to allow a read operation to be most preferentially processed even when the termination enable signal, and the non-target termination enable signal are input to the termination control circuit during the read operation.

8. The memory chip of claim 7, wherein the read operation is preferentially performed rather than termination operations based on the termination enable signal and the non-target termination enable signal even when the read enable signal is input during an on die termination operation.

* * * * *